United States Patent
Kim et al.

(10) Patent No.: US 7,242,232 B2
(45) Date of Patent: Jul. 10, 2007

(54) INTERNAL SIGNAL REPLICATION DEVICE AND METHOD

(75) Inventors: Chul-Soo Kim, Gyeonggi-do (KR); Byung-Hoon Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 73 days.

(21) Appl. No.: 11/126,428

(22) Filed: May 10, 2005

(65) Prior Publication Data

US 2005/0253631 A1   Nov. 17, 2005

(30) Foreign Application Priority Data

May 12, 2004   (KR) .................... 10-2004-0033380

(51) Int. Cl.
    *H03L 7/06*   (2006.01)
(52) U.S. Cl. ................... 327/158; 327/149; 327/161
(58) Field of Classification Search ............ 327/291, 327/298, 147, 149, 152, 153, 156, 158, 161, 327/162
    See application file for complete search history.

(56) References Cited

U.S. PATENT DOCUMENTS

| | | | |
|---|---|---|---|
| 5,463,337 A * | 10/1995 | Leonowich | 327/158 |
| 5,883,534 A * | 3/1999 | Kondoh et al. | 327/156 |
| 6,252,443 B1 * | 6/2001 | Dortu et al. | 327/156 |
| 6,281,726 B1 | 8/2001 | Miller, Jr. | 327/156 |
| 6,441,659 B1 * | 8/2002 | Demone | 327/156 |
| 6,466,071 B2 * | 10/2002 | Kim et al. | 327/175 |
| 6,535,043 B2 * | 3/2003 | Chen | 327/291 |
| 6,573,771 B2 * | 6/2003 | Lee et al. | 327/158 |
| 6,650,160 B2 | 11/2003 | Tanahashi | 327/277 |
| 6,847,241 B1 * | 1/2005 | Nguyen et al. | 327/158 |
| 6,963,235 B2 * | 11/2005 | Lee | 327/158 |
| 7,009,433 B2 * | 3/2006 | Zhang et al. | 327/158 |

FOREIGN PATENT DOCUMENTS

KR   2003-0037591   5/2003

OTHER PUBLICATIONS

English language abstract of Korean Publication No. 2003-0037591.

* cited by examiner

*Primary Examiner*—Timothy P. Callahan
*Assistant Examiner*—Hai L. Nguyen
(74) *Attorney, Agent, or Firm*—Marger Johnson & McCollom, P.C.

(57) ABSTRACT

We describe and claim an internal signal replication device and method. A circuit comprising a selector to select one of a plurality of internally generated clock signals, and a compensation circuit to replicate the selected clock signal from a reference clock signal.

19 Claims, 4 Drawing Sheets

INTERNAL SIGNAL REPLICATION DEVICE AND METHOD

REFERENCE TO RELATED PATENT APPLICATIONS

This application claims the priority from Korean Patent Application No. 2004-33380 filed on May 12, 2004, which we incorporate by reference.

BACKGROUND OF THE INVENTION

1. Field of the Invention

The present invention relates to an integrated circuit, and more particularly to an internal signal replication device and method.

2. Description of the Related Art

To precisely generate clock signals, integrated circuits include duty cycle compensation circuits to compensate for duty cycle variances of an externally provided clock signal. A typical integrated circuit with a duty cycle compensation circuit will now be described with reference to FIG. 1. FIG. 1 is a block diagram of an integrated circuit 100 with a duty cycle compensation circuit 110. The duty cycle compensation circuit 110 includes a DLL 111 to generate N delayed versions of an externally generated clock signal ECLK and a phase mixer 112 to generate a replica clock signal CLK_R according to the N delayed clock signals. A data output unit 120 receives cell data from a memory cell array (not shown) and transmits the cell data DQ responsive to the replica clock signal CLK_R. Integrated circuit 100 may be a memory as disclosed in Korean patent laid-open publication No. 2003-88232.

The relationship among the external clock signal ECLK, the replica clock signal CLK_R, and the memory cell data DQ is illustrated in FIG. 2. FIG. 2 is a timing diagram illustrating the operation of integrated circuit 100 shown in FIG. 1. Referring to FIG. 2, the integrated circuit 100 receives external clock signal ECLK and generates the replica clock signal CLK_R from the external clock signal ECLK. Since the integrated circuit 100 compensates for the duty cycle of the external clock signal ECLK when generating the replica clock signal CLK_R, there is a delay or latency between the reception of the external clock signal ECLK and the generation of the replica clock signal CLK_R. The integrated circuit 100 transmits the cell data DQ responsive to the replica clock signal CLK_R.

Testing the internal signals of integrated circuit 100, e.g., the delayed clock signals generated by the DLL 111 or signals for controlling the operation of memory cell array (not shown), remains difficult. For instance, to measure the internal signals the package containing the integrated circuit 100 must be decapped and probed using a probe tip or measured using electron beam (E-beam) probing with an oscilloscope. This testing process is not only inconvenient and complicated, but the results are potentially inaccurate since the internal signals are measured in a substantially different environment. In other words, decapping the package containing the integrated circuit 100 exposes the circuit to external noise, and thus internal signals are likely to be inaccurately measured.

SUMMARY OF THE INVENTION

We describe a circuit including a selector to select one of a plurality of internally generated clock signals, and a compensation circuit to replicate the selected clock signal from a reference clock signal.

We also describe a method including selecting one of a plurality of clock signals, and replicating the selected clock signal from a reference clock signal.

BRIEF DESCRIPTION OF THE DRAWINGS

The features and advantages of the present invention will become more apparent with the detailed description of the exemplary embodiments with reference to the attached drawings.

DETAILED DESCRIPTION OF THE INVENTION

Figure 1:
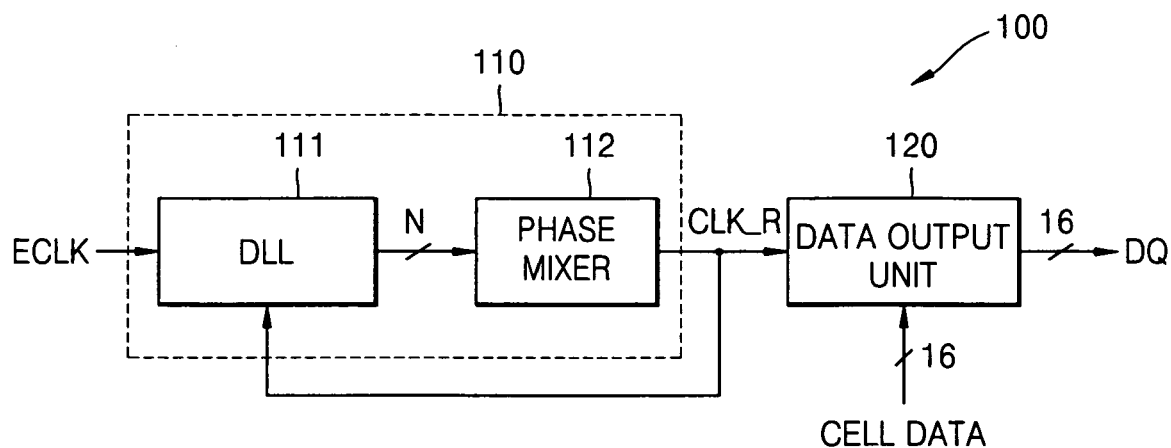
FIG. 1 is a block diagram of an integrated circuit with a conventional duty cycle compensation circuit.
Figure 2:
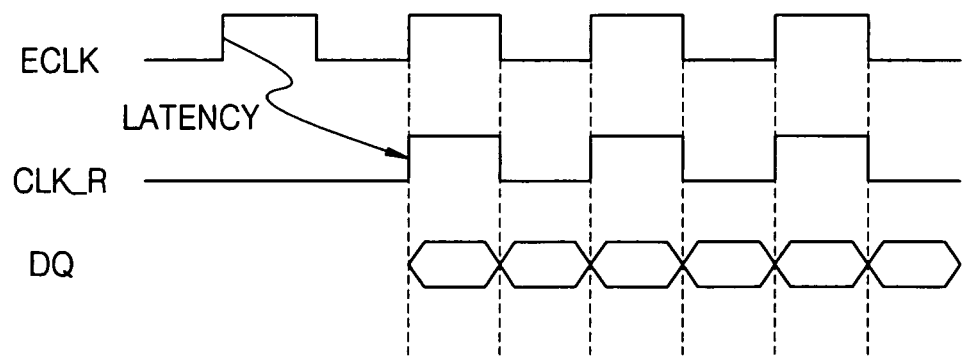
FIG. 2 is a timing diagram illustrating the operation of integrated circuit shown in FIG. 1.
Figure 3:
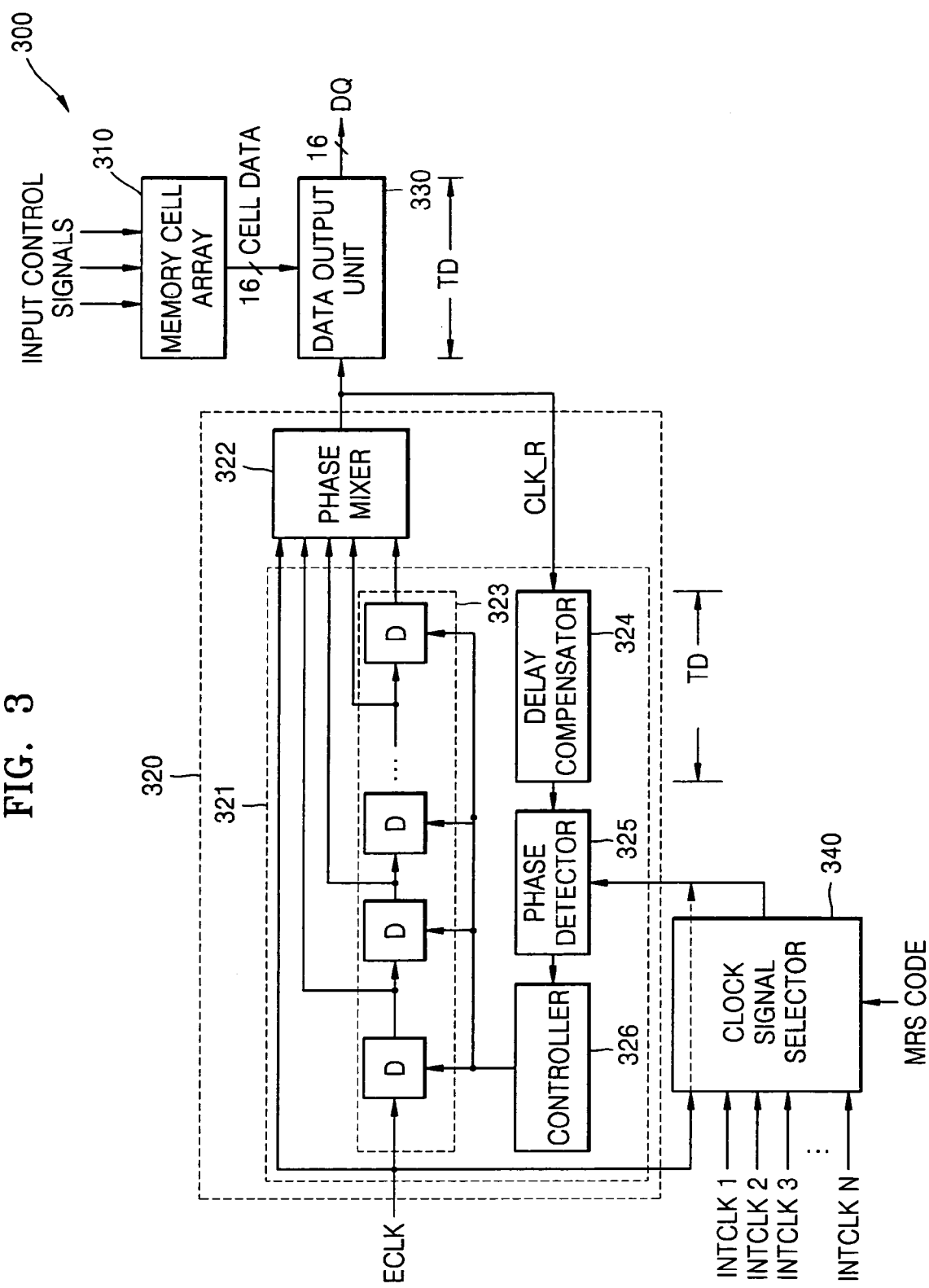
FIG. 3 is a block diagram of an integrated circuit with a duty cycle compensation circuit according to an embodiment of the present invention.

FIG. 3 is a block diagram of an integrated circuit 300 with a duty cycle compensation circuit 320 according to an embodiment of the present invention. Referring to FIG. 3, the integrated circuit 300 includes a memory cell array 310, a duty cycle compensation circuit 320, a data output unit 330, and a clock signal selector 340. The integrated circuit 300 may be a memory such as a Rambus Dynamic Random Access Memory (RDRAM) and Double Data Rate (DDR). Although FIG. 3 illustrates the integrated circuit 300 as a memory with the memory cell array 310, the present invention is not so limited and may be an apparatus that processes a video/audio signal, a transceiver for communications, or include a functional unit that provides data to data output unit 330 responsive to control signals.

The memory cell array 310 writes data to or reads data from the memory cells (not shown), responsive to input control signals such as a Row Action Signal (RAS), a Column Action Signal (CAS), or a precharge control signal. A person of skill in the art knows well use of the RAS, the CAS, and the precharge control signal when accessing memory.

In a normal operation mode, the duty cycle compensation circuit 320 generates a replica clock signal CLK_R by compensating for the duty cycle or duty factor of an external clock signal ECLK. The duty factor represents a percentage of a clock period, typically 50%, which is logically high. To guarantee the normal operation of the system, the duty cycle compensation circuit 320 generates the replica clock signal CLK_R with a constant duty factor. The memory cell array 310 provides cell data to the data output unit 330, where the data output unit 330 latches the cell data in response to the replica clock signal CLK_R. The latched cell data DQ may be provided to an external DQ pin via a DQ pad (not shown).

In a test operation mode, the clock signal selector 340 selects one of the internal clock signals INTCLK1-INTCLKN responsive to a Mode Register Set (MRS) code. The internal clock signals INTCLK1-INTCLKN may be generated internally to integrated circuit 300. The clock signal selector 340 may include a MRS register (not shown) to store the MRS code. A person of skill in the art knows well the use of MRS codes to test memory devices.

The duty cycle compensation circuit 320 generates the replica clock signal CLK_R by compensating for the duty factor of the selected internal clock signal in response to the external clock signal ECLK and the selected internal clock signal. In other words, the external clock signal ECLK is a reference clock signal used by duty cycle compensation circuit 320 to generate a replica of the selected internal clock signal. The data output unit 330 outputs data DQ responsive to the replica clock signal CLK_R. The memory cell array 310 may be controlled by the internal clock signals INTCLK1-INTCLKN.

The duty cycle compensation circuit 320 includes a delay locked loop (DLL) 321 and a phase mixer 322. The DLL 321 generates a plurality of delay signals with different phases by delaying the external clock signal ECLK responsive to the difference in phase between the replica clock signal CLK_R and the selected internal clock signal. The phase mixer 322 mixes the phases of the delay signals and generates the replica clock signal CLK_R by correcting the duty factor of the external clock signal ECLK. In other words, the phase mixer 322 generates the replica clock signal CLK_R with a duty factor of 50% in-phase with the selected internal clock signal.

The DLL 321 includes a plurality of delay cells 323, a delay compensator 324, a phase detector 325, and a controller 326. Each delay cell 323 generates a delay signal in response to a current control signal from the controller 326. The delay compensator 324 delays the replica clock signal CLK_R by a time delay TD corresponding to the time required for the cell data DQ to propagate through the data output unit 330 once latched responsive to the replica clock signal CLK_R. The phase detector 325 detects the difference in phase between the delayed replica clock signal CLK_R and the selected internal clock signal. The controller 326 generates the current control signal proportional to the difference in phase detected by the phase detector 325 and provides the current control signal to the plurality of delay cells 323. In the normal operation mode, the clock signal selector 340 selects the external clock signal ECLK and the phase detector 325 detects the difference in phase between the delayed replica clock signal CLK_R and the external clock signal ECLK. Although FIG. 3 shows the DLL 321 including a delay compensator 324 to delay the replica clock signal CLK_R as it is feedback into DLL321, in some embodiments it may be advantageous to omit the delay compensator 324.

Figure 4:
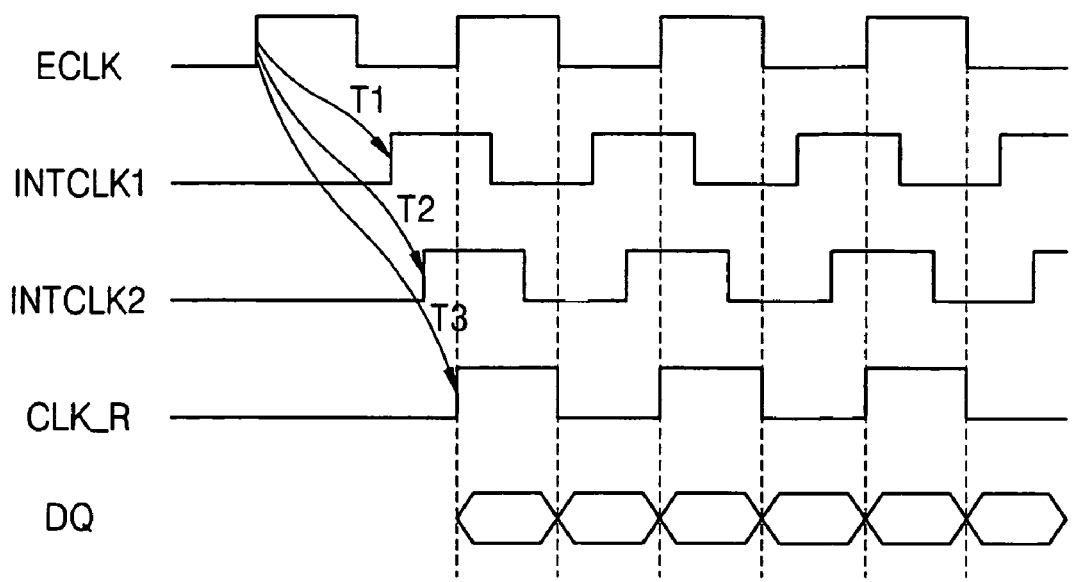
FIGS. 4–6 are timing diagrams illustrating the operation of the integrated circuit shown in FIG. 3.

The operation of the integrated circuit 300 will now be described in detail with reference to FIGS. 4-6. FIG. 4 is a timing diagram illustrating the operation of integrated circuit 300 in the normal operation mode. Referring to FIG. 4, in the normal operation mode, the integrated circuit 300 generates the replica clock signal CLK_R in-phase with the external clock signal ECLK, and thus the cell data DQ is synchronized with the external clock signal ECLK. The data output unit 330 provides the data DQ at time T3 after the external clock signal ECLK is activated. The external clock signal ECLK and the cell data DQ may be measured using a tester such as oscilloscope. FIG. 4 shows the timing of the internal clock signals INTCLK1 and INTCLK2, where the two internal clock signals INTCLK1 and INTCLK2 are activated at times T1 and T2 after the external clock signal ECLK is activated, respectively.

Figure 5:
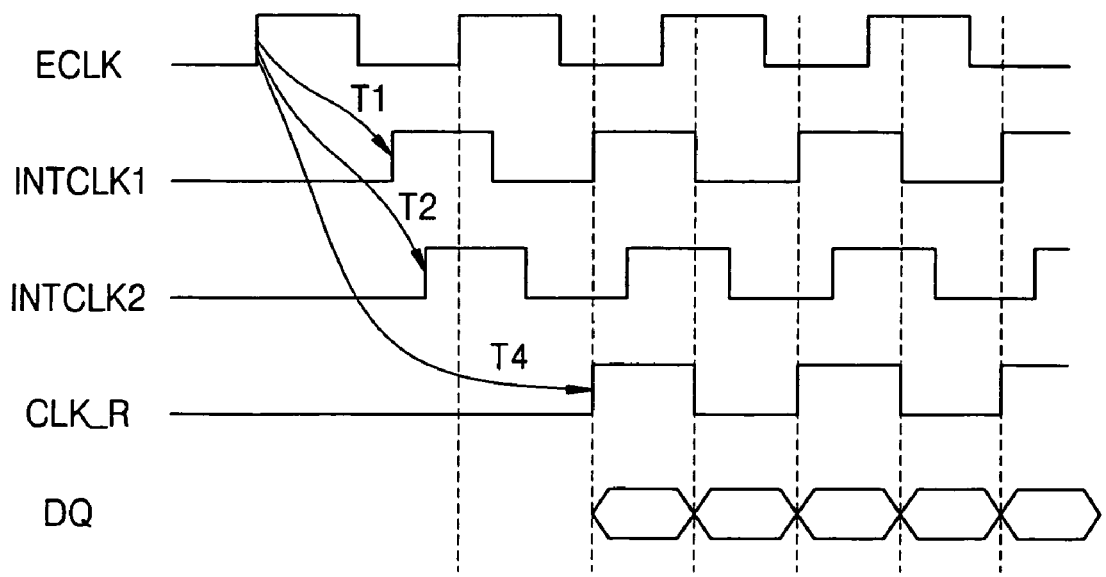
Figure 6:
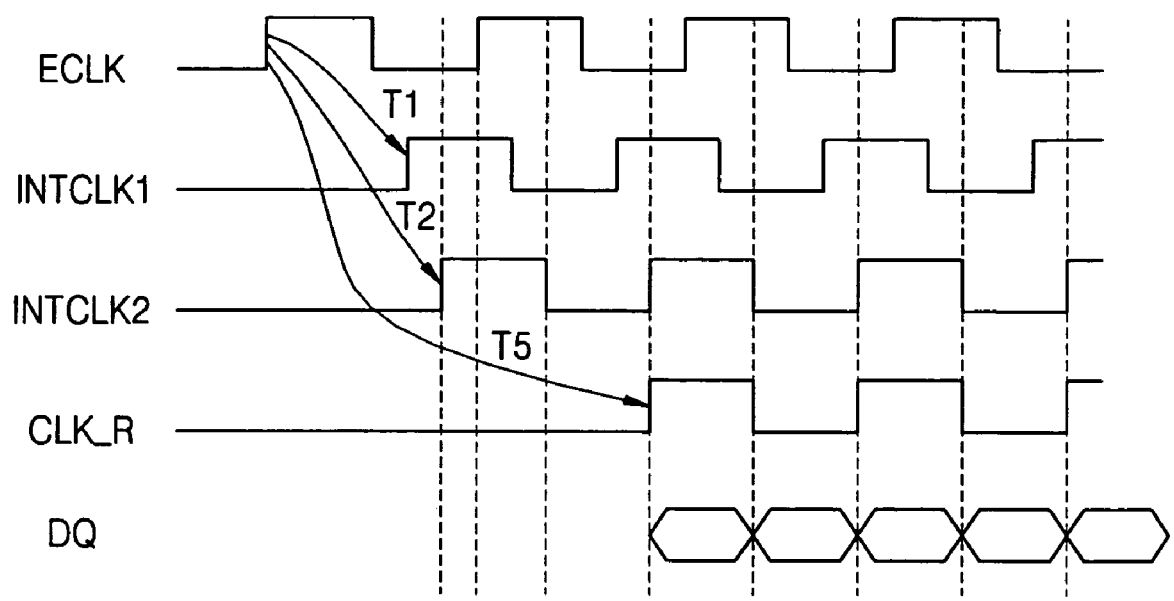

FIGS. 5 and 6 are timing diagrams illustrating the operation of integrated circuit 300 in the test operation mode. Referring to FIG. 5, in a test operational mode, the clock signal selector 340 selects internal clock signal INTCLK1 using the MRS code as described above, and the duty cycle compensation circuit 320 generates the replica clock signal CLK_R in-phase with the selected internal clock signal INTCLK1 at time T4 after activation of the external clock signal ECLK. The data output unit 330 outputs cell data DQ synchronized with the replica clock signal CLK_R and the selected internal clock signal INTCLK1. Thus, the cell data DQ and the external clock signal ECLK may be measured using a tester such as oscilloscope to determine the time T4, or the phase of the selected internal clock signal INTCLK1 relative to the external clock signal ECLK.

Referring to FIG. 6, in a test operational mode, the clock signal selector 340 selects internal clock signal INTCLK2 using the MRS code as described above, and the duty cycle compensation circuit 320 generates the replica clock signal CLK_R in-phase with the selected internal clock signal INTCLK2 at time T5 after activation of the external clock signal ECLK. The data output unit 330 provides cell data DQ that is synchronized with the replica clock signal CLK_R and the selected internal clock signal INTCLK2. Thus, the cell data DQ and the external clock ECLK may be measured using a tester such as oscilloscope to determine the time T5, or the phase of the selected internal clock signal INTCLK2 relative to the external clock signal ECLK.

The times T4 and T5 may be compared to determine a margin between the corresponding internal clock signals, where the margin may be used to determine whether the internal clock signals are timed properly. For instance, when the margin between internal clock signals is improper, accesses to memory cell array 310 may not occur correctly. Accordingly, the design of the integrated circuit 300 may be altered or the integrated circuit 300 may be determined to be defective responsive to the margin. Although FIGS. 5 and 6 show cell data DQ provided at times T4 and T5, respectively, the integrated circuit 300 may provide cell data DQ according to any of the internal clock signals INTCLK1-INTCLKN. Thus, the timing of the internal clock signals INTCLK1-INTCLKN generated in the integrated circuit 300 may be determined without decapping the package. Furthermore, since each internal clock signal timing is measured in the same environment as normal operation of the integrated circuit 300, the testing is hardly affected by noise, and precise and reliable results may be acquired.

While embodiments of the present invention have been particularly shown, it will be understood by those skilled in the art that various changes in form and details may be made without departing from the spirit and scope of the claimed invention.

We claim:

1. A circuit comprising:
    a selector to select one of a plurality of internally generated clock signals; and
    a compensation circuit to delay a reference clock signal according to a phase associated with the selected clock signal and to generate a replicated clock signal substantially in-phase with the selected clock signal responsive to the delay of the a reference clock signal.

2. The circuit of claim 1 where the circuit is configured in a memory device and the selector is operable to select a clock signal using mode register set code to test the circuit.

3. The circuit of claim 1 where the compensation circuit includes a delay locked loop to generate a plurality of delay signals from the reference clock signal responsive to the selected clock signal; and
    a phase mixer to generate the replicated clock signal responsive to the plurality of delay signals.

4. The circuit of claim 3 where the delay locked loop includes a phase detector to detect a phase difference between the replicated clock signal and the selected clock signal; and
  a plurality of delay cells, each to generate one of the plurality of delay signals according to the phase difference and the reference clock signal.

5. The circuit of claim 4 where the delay locked loop includes a delay compensator to delay the replicated clock signal; and
  where the phase detector is operable to detect the phase difference between the delayed clock signal and the selected clock signal.

6. The circuit of claim 5 where the delay locked loop includes a controller to generate a control signal according to the phase difference; and
  where the plurality of delay cells are operable to generate the delay signals responsive to the control signal and the reference clock signal.

7. The circuit of claim 1 comprising a data output unit to latch data response to the replicated clock signal;
  where the selector is operable to select another one of the plurality of clock signals;
  where the compensation circuit is operable to generate another replicated clock signal responsive to the other selected clock signal and the reference clock signal;
  where the data output unit is operable to latch data responsive to the other replicated clock signal; and
  where a relationship between the data latched responsive to the replicated clock signal and the data latched responsive to the other replicated clock signal indicates whether the circuit is defective.

8. The circuit of claim 7 comprising a memory cell array to provide the data to be latched to the data output unit.

9. A method comprising:
  selecting one of a plurality of clock signals;
  generating multiple delay signals from a reference clock signal according to a phase associated with the selected clock signal; and
  generating a replicated clock signal substantially in-phase with the selected clock signal responsive to the delay signals.

10. The method of claim 9 including latching data responsive to the replicated clock signal.

11. The method of claim 10 includes
  selecting another one of a plurality of clock signals;
  generating multiple delay signals from a reference clock signal according to a phase associated with the other selected clock signal; and
  generating another replicated clock signal substantially in-phase with the other selected clock signal responsive to the delay signals; and
  latching data responsive to the other replicated clock signal, where a relationship between the data latched responsive to the replicated clock signal and the data latched responsive to the other replicated clock signal indicates whether a device generating the plurality of clock signals is defective.

12. The method of claim 9 including detecting a phase difference between the replicated clock signal and the selected clock signal; and
  generating the plurality of delay signals according to the phase difference and the reference clock signal.

13. The method of claim 12 including delaying the replicated clock signal; and
  detecting the phase difference between the delayed clock signal and the selected clock signal.

14. The method of claim 12 including generating a control signal according to the phase difference between the replicated clock signal and the selected clock signal; and
  generating the delay signals responsive to the control signal and the reference clock signal.

15. A device comprising:
  a selector to select one or more of a plurality of test clock signals;
  a phase mixer to generate a replicated clock signal responsive to multiple delay signals, where the delay signals are delayed versions of the reference clock signal; and
  a delay lock loop to detect a phase difference between the replicated clock signal and the selected test clock signal and to generate delay signals according to the phase difference and the reference clock signal.

16. The device of claim 15 including
  a data output unit to latch data responsive to the replicated clock signal
  where the selector is operable to select another one of the plurality of clock signals;
  where the phase mixer is operable to generate another replicated clock signal responsive to the other selected clock signal and the reference clock signal;
  where the data output unit is operable to latch data responsive to the other replicated clock signal; and
  where a relationship between the data latched responsive to the replicated clock signal and the data latched responsive to the other replicated clock signal indicates whether the device is defective.

17. The device of claim 15 where the delay lock loop includes
  a controller to generate a current control signal responsive to the phase difference between the replicated clock signal and a selected test clock signal; and
  a plurality of delay cells, each to generate at least one of the delay signals responsive to the reference clock signal and the current control signal.

18. The device of claim 15 including
  a data output unit latch cell data responsive to the replicated clock signal
  where the delay lock loop includes a delay compensator to delay the replicated clock signal by a preset time delay, the time delay substantially equal to the propagation delay associated with the data output unit.

19. The device of claim 15 where the selector is configured to select the reference clock signal, where the replicated clock signal is in-phase with the selected reference clock signal.

* * * * *

UNITED STATES PATENT AND TRADEMARK OFFICE
CERTIFICATE OF CORRECTION

PATENT NO. : 7,242,232 B2
APPLICATION NO. : 11/126428
DATED : July 10, 2007
INVENTOR(S) : Chul-Soo Kim et al.

It is certified that error appears in the above-identified patent and that said Letters Patent is hereby corrected as shown below:

Column 5, line 21, the word "response" should read -- responsive --;
Column 6, line 11, the word "detay" should read -- delay --.

Signed and Sealed this

Fifth Day of August, 2008

JON W. DUDAS
*Director of the United States Patent and Trademark Office*